United States Patent [19]

Keren

[11] Patent Number: 5,055,792
[45] Date of Patent: Oct. 8, 1991

[54] MINIATURIZED SURFACE PROBES

[75] Inventor: Hanan Keren, Kfar Saba, Israel

[73] Assignee: Elscint, Limited, Haifa, Israel

[21] Appl. No.: 462,469

[22] Filed: Jan. 9, 1990

[30] Foreign Application Priority Data

Jan. 27, 1989 [IL] Israel .................................... 089107

[51] Int. Cl.⁵ .......................................... G01R 33/20
[52] U.S. Cl. ................................................. 324/318
[58] Field of Search ............... 324/310, 318, 322, 307, 324/314

[56] References Cited

U.S. PATENT DOCUMENTS 4,641,097 2/1987 Bottomley et al. ................. 324/322
4,792,759 12/1988 Keren et al. ......................... 324/318
4,827,219 5/1989 Harrison ............................. 324/322
4,835,472 5/1989 Zabel et al. ......................... 324/318

Primary Examiner—Hezron E. Williams
Assistant Examiner—Louis M. Arana
Attorney, Agent, or Firm—Sandler, Greenblum & Bernstein

[57] ABSTRACT

A miniaturized surface probe for use with magnetic resonance (MR) systems. The probe comprises a conductor loop for use juxtaposed to a patient. A tuning and matching section connects the probe to the receiver. The section tunes the loop to the desired Larmor frequency and matches the loop to the MR system. A $N\lambda/2$ length of shielded cable is used to couple the loop to the spatially removed tuning and matching section.

8 Claims, 2 Drawing Sheets

MINIATURIZED SURFACE PROBES

FIELD OF THE INVENTION

This invention is concerned with radio frequency coils or probes and more particularly with such probes used as surface probes in magnetic resonance (MR) data acquisition systems.

BACKGROUND OF THE INVENTION

This invention is related to earlier inventions, one of which is entitled "Dual Frequency Surface Coils" the other of which is entitled "Multiple Frequency Surface Probes." The above Patent Applications are assigned to the Assignee of this inventions. The first of above-listed invention was described in a Patent Application filed in the U.S. on Mar. 19, 1985, and received Ser. No. 713,689. It issued on Sept. 1, 1987, as U.S. Pat. No. 4,691,163. The second above-listed Patent Application was filed in the United States on July 29, 1987, and received Ser. No. 78,895. It issued Dec. 20, 1988, as U.S. Pat. No. 4,792,759.

In MR data acquisition systems, radio frequency (RF) coils or probes are used to transmit RF pulses which perturb or tip onto a transverse plane, nuclei ("spins") that have magnetically aligned along a large static magnetic field. After the RF pulses are removed, the perturbed nuclei tend to dephase and to revert to the former aligned positions. The movement of the nuclei in the transverse plane creates detectable signals known as free induction decay (FID) signals.

When combinations of RF and gradient pulses are applied the dephasing nuclei are rephased and RF echo signals are generated. The FID and/or echo signals are detected by RF coils to provide data used for generating display images.

The most commonly perturbed element in magnetic resonance imaging (MRI) is hydrogen. Other elements are also perturbed, such as, for example, sodium. Also, for a long time it has been known that phosphor can also provide unique information when subjected to large static magnetic fields and perturbed by RF pulses. Thus, phosphor has been perturbed to obtain magnetic resonance spectrographic data.

Data signals are created by the nuclei which when dephasing cut magnetic lines of force. The RF pulses are applied using RF coils or probes. The signals are detected either using the same coils or separate receiving coils especially designed for detecting the weak signals. Because the signals are so weak everything that is possible is done to enhance the signals to enable obtaining images and/or spectrographic information from the signals.

For a long time MRI data was acquired using body coils; that is, coils large enough to receive the patient. Subsequently, it has been found that the use of surface coils applied at the surface of the patient's skin and relatively close to the portion of the patient being imaged enhances the acquisition of the signals needed for data acquisition purposes. The surface coils are in addition to the regular RF body coil built into the magnet along with gradient coils and the coil which generates the large static magnetic field.

The surface coils have to be matched to the system impedance and tuned to the appropriate Larmor frequency which is a function the type of nuclei from which data is acquired. To properly match surface coils requires components such as resistors and capacitors. To properly tune the surface coil also requires capacitance usually in the form of capacitors. Thus to match and/or tune the surface coils additional components have to be coupled to the coils. The additional components increase the minimum size of the surface coils even when the components are miniaturized.

In instances when the surface coils are used to obtain data at more than one Larmor frequency even more components have to be added to the surface coil to tune it to more than one frequency and accordingly the size of the surface coil increases and its reliability decreases.

It is desirable that surface coils be as small as possible to focus the transmitted radio frequency pulses at the portion of the patient from which data acquisition is desired and to receive signals primarily from a selected portion of the patient juxtaposed to the surface coil. Thus, there are the following seemingly conflicting goals for the idealized surface probe:

(1) it is desirable that the surface probe be as small as possible; and
(2) it is desirable that the surface probe be properly matched and tuned.

The conflict of goals is further amplified when the surface probe is the type used to receive data at more than one frequency.

Accordingly, there is a long felt need for miniaturized surface probes that can be properly matched and tuned and although small in size still suffice to detect the small signals of MR systems at more than one frequency.

BRIEF DESCRIPTION OF THE INVENTION

In accordance with the present invention a miniaturized radio frequency (RF) tuned and matched surface probe for magnetic resonance (MR) data acquisition is provided, said probe comprising:

a tuning and matching coil section, a probe section comprising a loop for use juxtaposed to the patient, coupling means for coupling said tuning and matching section to said probe section to enable said probe section to be tuned and matched.

A feature of the invention includes coupling means that comprise an $N\lambda/2$ section.

Another feature of the invention is where the probe section is miniaturized and contains no components other than a conductor arranged in a loop.

BRIEF DESCRIPTION OF THE DRAWINGS

The above mentioned and other features and objects of the present invention will be better understood and become more apparent by referring to the following description of the broad aspects of the present invention taken in conjunction with the accompanying drawings, wherein.

GENERAL DESCRIPTION

Figure 1:
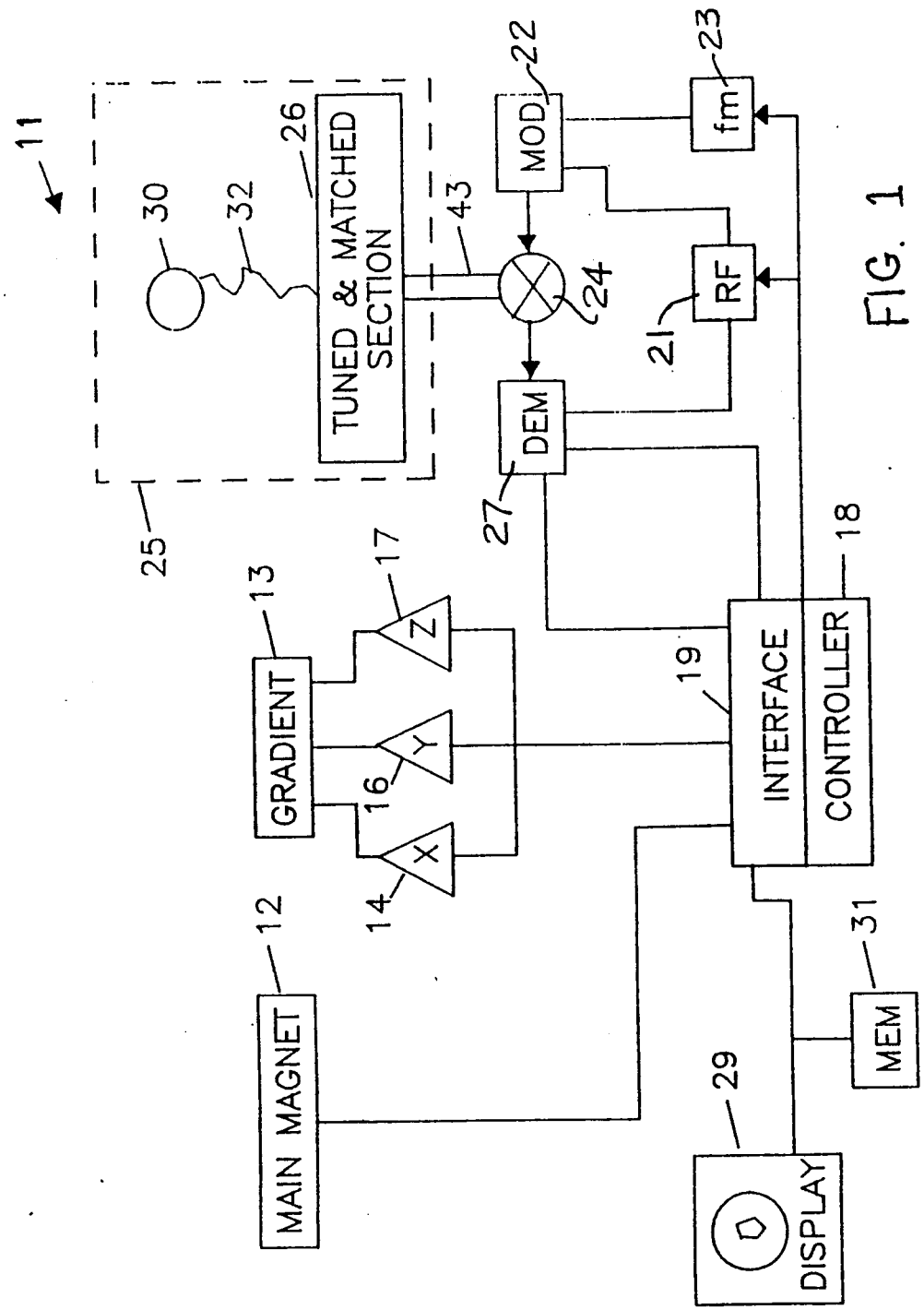
FIG. 1 is a block diagram showing of a magnetic resonance system connectable in either a receiving or a transmitting mode and using the inventive miniaturized surface probe.

FIG. 1 at 11 shows an MR system which may be used for MR spectrometry and/or for magnetic resonance imaging (MRI) data acquisition purposes. There is shown, a main magnet 12 which provides a large static magnetic field that causes the nuclei being examined to align with the magnetic field. Gradient magnetic field generators 13, for providing gradients in the magnetic field in the X, Y and Z directions are indicated. The gradient fields enable locating the source of the detected FID or echo signals. The gradient magnets are driven by the gradient amplifiers such as X gradient amplifier 14, Y gradient amplifier 16 and Z gradient amplifier 17. The magnetic resonance system including the amplifiers are under the control of controller 18 operating through interface unit 19, for example.

The gradients, as is well known, are used to locate the portion of the subject from which signals are received. With the gradients selectively energized, a radio frequency probe is pulsed to perturb the nuclei of a desired element. This is accomplished by using an RF pulse at a given frequency according to the well known Larmor relationship. For example, to perturb or "tip" hydrogen elements in a 1 Tesla field a frequency of 42.5 MHz is used. An RF generator 21 operates at the selected frequency. Its output is supplied to a modulator 22 which is also operated on by a function generator 23 to provide a shaped RF pulse, if such a shaped pulse is desired.

The RF pulse is transmitted through a switching means 24 to RF probe 25. While not indicated in FIG. 1, the probe 25 shown preferably is a surface probe. In the MR system an RF coil is also provided within the confines of the main magnet. That coil is not shown nor discussed since this invention is concerned with the surface probe.

The surface probe may be used to detect "FID" or echo signals. The detected signals are transferred by a shielded cable 43 through the switching means 24 to a demodulating circuit 27. The demodulating circuit has another imput from the RF generator 21. The signal output of the demodulator is coupled to the controller 18 where the signals are processed as data for imaging and/or for spectroscopy. The imaging data is used to form an image for display purposes on display circuit 29 in combination with the memory means 31.

In accordance with a preferred embodiment, the miniaturized surface probe 25 comprises a tuning and matching section 26 and a miniaturized probe section 30 joined together with a shielded cable coupling section 32. The miniaturized probe section in a preferred embodiment comprises a single loop coil coupled to the tuned and matched section 26. The miniaturized probe section 30 operates in conjunction with the shielded cable coupling section 32 used for coupling the miniaturized probe section 30 to the tuned and matching section 26. The length of the shielded cable is a multiple of $\lambda/2$ at the Larmor frequency being used.

It is well known that in RF, half wavelength sections of shielded cable and multiples thereof effectively transfer the components connected to one side of the shielded cable to the other side. Thus, the single loop probe section is effectively tuned and matched.

Figure 2:
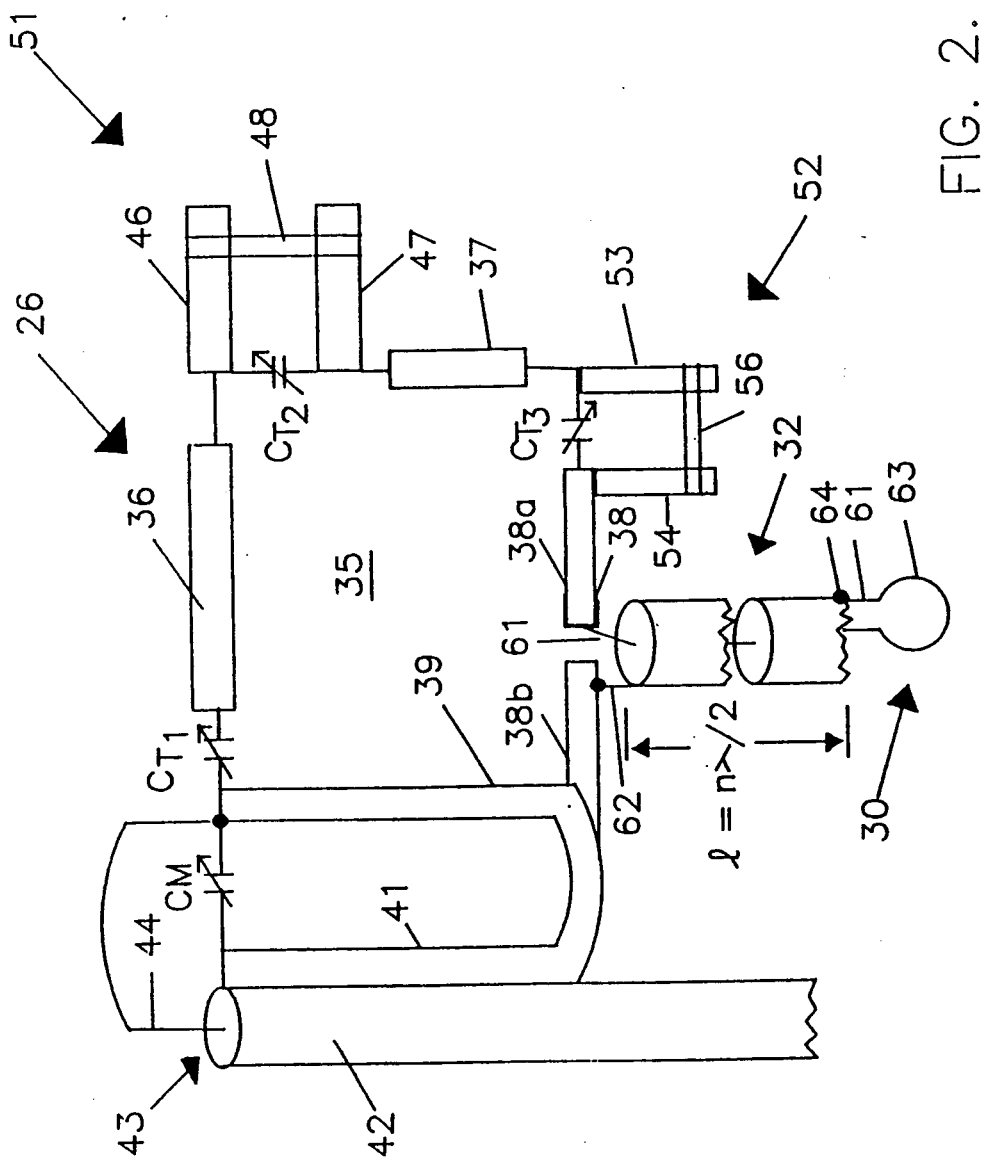
FIG. 2 is a pictorial plan diagram showing of a generalized embodiment of the inventive miniaturized probe.

FIG. 2 demonstrates a tuning and matching section 26 used in conjunction with the single loop probe section 30 of the miniaturized surface probe 25. The tuning and matching section of FIG. 2 is connected through a single terminal pair and provides a plurality of resonant frequencies but nonetheless maintains a characteristic impedance.

For practical purposes in order to use the same probe for at least two different resonant frequencies, it is important that the tuned and matching section resonate at both desired frequencies and also has a matching impedance at both frequencies.

The pictorial plan view of FIG. 2 shows a distributed sampling coil arrangement for use in the multi-frequency tuned miniaturized surface probe 25 of this invention. The tuning and matching section comprises a coil 35. The coil 35 is distributed between coil portions 36, 37, 38 and 39. The four coil portions are shown placed in a square loop arrangement. The arrangement, of course, could be circular, rectangular, ellipsoidal or other geometrical arrangements.

In a preferred embodiment, the coil portions are each copper straps approximately 10 cm in length and about ⅜ of an inch wide. Tuning capacitors are located between the coil portions, such as capacitor CT1 connecting coil portions 39 and 36. In a similar manner, capacitor CT2 connects coil portion 36, 37 and capacitor CT3 connects coil portion 37 and 38.

The matching capacitor CM is preferably coupled between coil portion 39 and a coupling coil 41. The coupling coil 41 is in effect the secondary of a broad band matching transformer. Coupling coil 41 is attached along a length of the shield 42 of shielded cable 43 which connects the probe 25 to the switching means 24. Inner conductor 44 of shielded cable 43 is connected to the junction of matching capacitor CM connected between sampling coil portion 39 and coupling coil 41. The sampling coil and the tuning capacitors are tuned to one of the plurality of radio frequencies that are used for transmitting pulses and receiving signals to manipulate spins to acquire desired FID signals or echoes from the sample under test.

Means are provided for tuning to alternate frequencies. For example, attached to opposite sides of capacitor CT2 are a pair of parallel copper strips 46 and 47. The parallel copper strips 46, 47 make a tuned coil. These copper strips are attached together by a movable strip 48 which is used to vary the inductance and accordingly, the tuned frequency of the trap or tank circuit 51. The tank circuit, of course, comprises the coil portions 46, 47 and 48 and tuning capacitor CT2. The trap circuit 51 is tuned for whichever one of the desired plurality of frequencies is operative.

If yet another frequency is desired, then a similar inductor bridged by capacitor CT3 is used to form a trap circuit 52. The trap circuit 52 is comprised of conductors 53 and 54 attached to opposite sides of capacitor CT3 joined by a movable strip 56 used to vary the inductance and thereby for tuning the trap circuit 52 to a desired one of a multiple of radio frequencies. Other trap circuits could be used in series with the basic sampling coil arrangement 26 to provide even more resonant frequencies.

In one preferred embodiment where the magnetic field strength is 1.9 Tesla CT1 is 75 PF, CT2 is 105 PF, CT3 is 180 PF. The copper strips 46 and 47 are about 6-7 centimeters long, while the strips 53 and 54 are 4 cm long. Matching capacitor CM is approximately 51 PF. The shielded cable has a 50 Ohm characteristic impedance.

The preferred embodiment shown in FIG. 2 is matched from 10 to 90 MHz. The basic sampling coil is tuned for 81 MHz. The tank circuit 51 is tuned to 47 MHz. The tank circuit 52 may be tuned for 40.5 MHz.

The coupling of the probe section 30 to the tuning and matching section 26 is done over the coaxial cable section 32 which has a length of $N\lambda/2$. The coupling of the parts 38a and 38b of coil portion or conductor section 38 is accomplished by connecting the center wire 61 of coaxial cable 32 to a part 38a of coil portion 38.

The shielding of the coaxial cable 32 is connected to coil portion 38b of conductor section 38 by a portion of the shielding 62. Note that the coil portion 38 is divided into two non-continuous parts 38a and 38b whose only connection together is through the coaxial cable 32.

The miniaturized probe section 30 in a preferred embodiment is comprised of a single loop 63 as an integral portion of the central conductor 61 of the coaxial cable 32. The loop 63 also may be connected to the shielding of coaxial cable 32 by the connecting conductor 64. The loop 63 is held adjacent to the portion of the patient from which data is being acquired and it can be made as small as desired. Nonetheless, the loop retains the impedance and resonance characteristics of the tuned and matched section 26. Therefore, the probe 25 in fact, can be used at a multiplicity of frequencies. Since only one coaxial cable 32 is used to couple loop 63 to tuned and matched section 26 of probe 25, the different resonant frequencies used must be related so that the length of the coaxial cable 32 is a multiple of $\lambda/2$ at each of the resonant frequencies.

While a particular tuning and matching section 26 is shown it should be understood that many different tuned and matched sections can be used as part of the inventive probe.

Accordingly, a unique miniaturized coil arrangement is provided which can be used with many different types of tuned and matched sections and enable the actual probe section to be sufficiently small to excite that portion of the patient from which data is desired. In operation, the system 11 of FIG. 1 is connected to the probe 25. The loop 30 of probe 25 is used juxtaposed to the patient that is placed within the main magnet. The method of utilization of probe 25 enables the tuning and matching section 26 to be far from the patient while the probe section is applied juxtaposed to that portion of the patient from which data is to be acquired. The probe section is preferably miniaturized to the point of comprising a single loop. It is attached to the tuning and matching section with a coaxial cable section having a length equal to a multiple of half the wave length ($\lambda/2$) at the Larmor frequency being utilized for data acquisition.

While the invention has been explained using specific embodiments, it should be understood that these embodiments as described by way of example only and not as limitations on the scope of the invention which is defined by the accompanying claims.

What is claimed is:

1. A miniturized surface probe for use in magnetic resonance (MR) data acquisition comprising:
   a tuning and matching section,
   a probe section for use juxtaposed to the patient,
   said probe section being spaced apart from said tuning and matching section,
   a coupling section for coupling said tuning and matching section to said probe section, said coupling section comprising a shielded cable coupled at one end thereof to said tuning and matching section,
   said shielded cable having a length that is an integral multiple of a half-wave length at the Larmor frequency being used for data acquisition,
   said tuning and matching section comprising four separate conductors serially connected to form a closed circuit coil with a serially connected tuning capacitor between at least two of said conductors, each quarter of the closed circuit coil comprising one of each of the four separate conductors,
   said tuning capacitor tuning said closed circuit coil to at least one Larmor frequency used for data acquisition, and
   said probe section consisting of the central conductor of said shielded cable arranged to form a probe loop.

2. The miniaturized surface probe of claim 1 wherein said capacitors tune said tuning and matching section to at least two Larmor frequencies, having one frequency that is substantially an integral multiple of the other frequency.

3. The miniaturized surface probe of claim 1 wherein said coupling section being coupled to said tuning and matching section at an opening in one of said conductors.

4. The miniaturized surface probe of claim 3, wherein:
   said shielded cable being connected to said tuning and matching section at said opening by connecting the inner conductor of said shielded cable to one side of said opening and the shielding conductor of said shielded cable to the other side of said opening, and
   said loop means comprising said inner conductor looped and coupled to a shielding conductor of said shielded cable.

5. The miniaturized surface probe of claim 1 wherein said conductors comprise copper straps.

6. The miniaturized surface probe of claim 7 including:
   tuning capacitor means in series with said coil for tuning said probe to the desired frequencies,
   at least one parallel tuned circuit in series with said coil for tuning said probe to another desired frequency,
   matching capacitor means coupled between a center conductor of another shielded cable, and a shielding conductor of said another shielded cable,
   said another shielded cable being used for coupling said tuning and matching section to a magnetic resonance data acquisition system, and
   said tuning and matching section being coupled to the shield of the another shielded cable through coupling coil means.

7. The miniaturized surface probe of claim 6 wherein said coupling coil means is a broad band matching transformer.

8. The miniaturized surface probe of claim 6 wherein said parallel tuned circuit comprises a pair of parallel conducting strips bridged by a movable conducting strip for varying the inductance of the parallel tuned circuit and said tuning capacitor means.

* * * * *